Sept. 14, 1965 H. L. ARMSTRONG 3,206,611
POLYSTABLE SEMICONDUCTOR DEVICE
Original Filed Jan. 19, 1954 3 Sheets-Sheet 1

INVENTOR.
HAROLD L. ARMSTRONG
BY
ATTORNEY

INVENTOR.
HAROLD L. ARMSTRONG
BY
Francis h. Mossel[illegible]
ATTORNEY

*INVENTOR.*
HAROLD L. ARMSTRONG
*BY* Francis N. Masselle
ATTORNEY 3,206,611
POLYSTABLE SEMICONDUCTOR DEVICE
Harold L. Armstrong, Euclid, Ohio, assignor to Clevite Corporation, Cleveland, Ohio, a corporation of Ohio
Original application Jan. 19, 1954, Ser. No. 404,851, now Patent No. 2,927,221, dated Mar. 1, 1960. Divided and this application July 9, 1959, Ser. No. 830,978
7 Claims. (Cl. 307—88.5)

This invention relates to a semiconductor device for use in various electrical circuits and is a division of Patent No. 2,927,221, filed January 19, 1954, entitled Semiconductor Devices and Trigger Circuits Therefor in the name of H. L. Armstrong.

In its broad general aspect the present invention is concerned with the provision in various electrical devices of a novel semiconductor configuration in which a pair of base electrodes have ohmic contacts to opposite ends of a semiconductor for establishing an electric field therein, and a plurality of other electrodes have rectifying junction contacts to the semiconductor at locations thereon which are normally at the same potential, intermediate the respective potentials at the base electrodes. In the absence of a change in the potential gradient between the ends of the semiconductor, no current flows between any of the junction and base electrodes through the semiconductor. However, when the potential gradient in the semiconductor between a predetermined one of the junction electrodes and one of the base electrodes is altered, current is caused to flow between that junction electrode and the corresponding base electrode through the semiconductor, current at the other junction electrode or electrodes being cut off at this time. This condition remains stable until the potential relations between the conducting junction electrode and the semiconductor change so that current at this electrode is cut off and current flows at one of the previously non-conducting junction electrodes, and so on, in a controlled sequence.

The foregoing generic principles of the present invention may be employed advantageously in a variety of semiconductor configurations which may be used in various practical circuits including, but not limited to, bistable and polystable circuits, square wave generators, wave squarers, and ring counters.

Accordingly, it is an object of the present invention to provide a novel semiconductor device adapted for use in a variety of electrical apparatus.

Another object of the present invention is to provide a novel bistable circuit employing a semiconductor device.

A further object is to provide a semiconductor device and associated circuitry which is stable in any one of several current conducting conditions in the semiconductor.

Still another object of this invention is to provide a novel ring counter which employs a semiconductor.

These and other objects and advantages of the present invention will be apparent from the following description of several preferred embodiments thereof, which are shown in the accompanying drawings to illustrate the principles of the present invention without intending, however, that this invention be considered as being limited to these specific embodiments.

Figure 1:
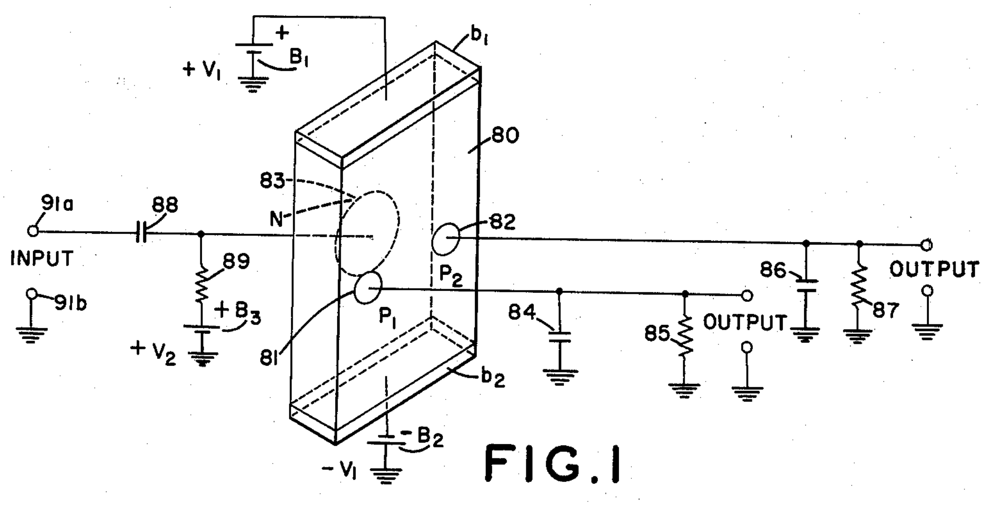
FIGURE 1 is a perspective view of one embodiment of the present invention, including a semiconductor together with a schematic diagram of a circuit providing bistable operation.

Referring to the drawings, in FIGURE 1 there is shown an embodiment of the invention, which may be used for bistable circuit operation. In this embodiment there is provided an intrinsic semiconductor in the form of a thin, relatively wide, rectangular bar 80 of purified germanium. A base electrode $b_1$ has ohmic contact with one end of the semiconductor and is maintained at a positive potential $+V_1$, as by battery $B_1$. At the other end of semiconductor 80, the base electrode $b_2$ has ohmic contact, this electrode being at a negative potential $-V_1$ applied by battery $B_2$. On one face of the semiconductor, midway between its ends, a pair of spaced indium dots 81 and 82 are fused into the germanium to provide rectifying P junctions thereat, denoted $P_1$ and $P_2$ in FIG. 1. One the opposite face of the semiconductor, a relatively large mass 83, of lead-antimony alloy is fused into the germanium to provide a rectifying N junction thereat. The N junction is located on this face of the semiconductor midway between the base electrodes $b_1$ and $b_2$ and has its opposite ends disposed directly opposite the $P_1$ and $P_2$ junctions, respectively.

In the FIG. 1 circuit, the $P_1$ junction is connected to a parallel combination of condenser 84 and resistor 85, which have their opposite terminals grounded. In like manner, the $P_2$ junction is connected to a parallel combination of condenser 86 and resistor 87, which have their opposite terminals grounded. The N junction is connected through a coupling condenser 88 to a source of negative input voltage applied between terminals 91*a* and 91*b*. A resistor 89, is connected between a positive voltage $+V_2$ (provided by battery $B_3$) and the N junction, so that normally the N junction is biased positive with respect to ground and positive with respect to the contiguous portion of the semiconductor.

Figure 2:
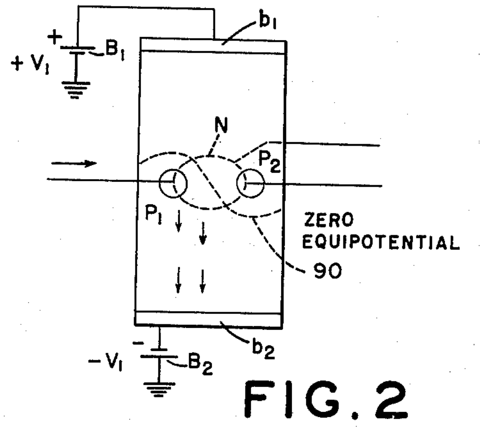
FIGURES 2–5 are schematic views showing the current and voltage conditions in the FIGURE 1 semiconductor device in successive stages of its operation.

Theoretically, if the FIG. 1 device were perfectly balanced, none of the P and N junctions would draw current in the absence of an input signal. However, this theoretical condition will not hold true in practice and by suitable design one or the other of the P junctions can be caused to start drawing current in the absence of an input signal. Assuming (FIG. 2) that the $P_1$ junction starts conducting first, the hole current emitted into the semiconductor by $P_1$ will be swept toward the negative base electrode $b_2$. This lowers the resistivity of the semiconductor under the $P_1$ junction and distorts the potential gradient in the semiconductor so that the zero equipotential 90 will assume the position shown in FIG. 2. The $P_2$ junction, grounded at this time, will have a potential negative with respect to the contiguous semiconductor material and therefore will be cut off.

Figure 3:
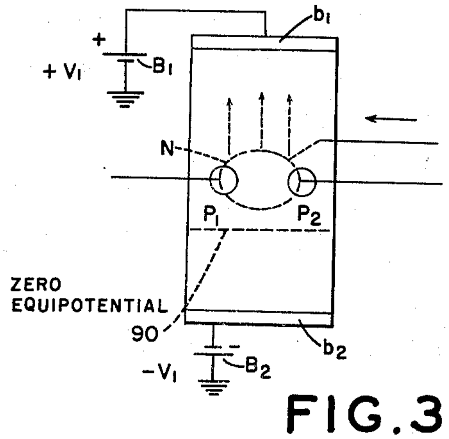

When a negative input signal is applied at terminals 91*a*, 91*b*, the N junction will go negative with respect to the contiguous semiconductor material and will inject electrons into the semiconductor. These electrons will flow up to the positive base electrode $b_1$, distorting the potential gradient in the semiconductor so that the zero equipotential 90 will assume the location shown in FIG. 3, between the junctions and the negative base electrode $b_2$. The semiconductor contiguous to both P junctions will have a potential negative with respect to both, and both $P_1$ and $P_2$ will be cut off.

Figure 4:
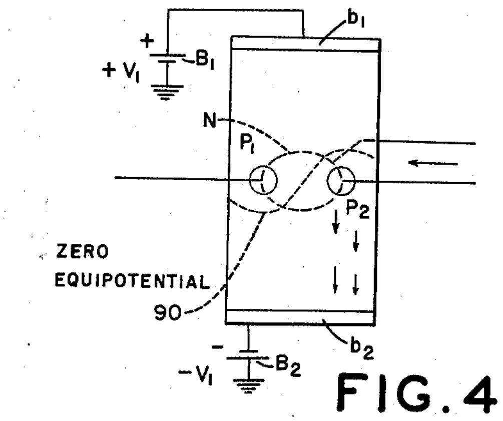

At the end of the negative input signal, the zero equipotential will tend to move away from the negative base electrode $b_2$. At this time the $P_2$ junction is still at ground potential, while the $P_1$ junction is slightly negative with respect to ground because in its previous conducting state it had rendered the upper terminal of condenser 84 negative with respect to ground, which condition cannot change instantaneously. Therefore, the other P junction, $P_2$, being at a higher potential will begin to draw current first. The N junction ceases to draw current due to its positive bias from $+V_2$. The holes injected by $P_2$ into the semiconductor will be swept toward the negative base electrode $b_2$, distorting the potential gradient in the semiconductor so that the zero equipotential 90 will assume the position shown in FIG. 4. $P_1$ remains cut off.

Figure 5:
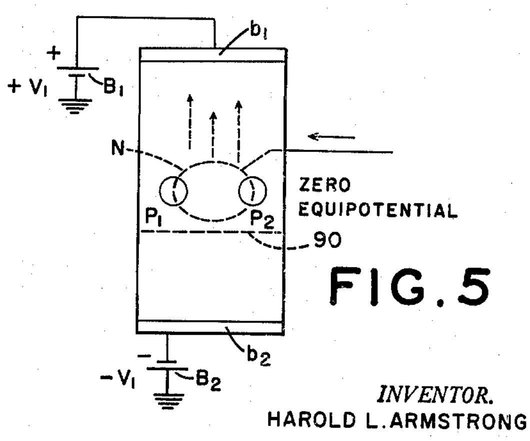

The next negative input signal to terminals 91*a* and 91*b* drives the N junction negative with respect to the contiguous semiconductor material, cutting off both P junctions (FIG. 5) as before.

At the completion of this negative input pulse, the $P_1$ junction will draw current and the $P_2$ junction remains cut off. Thus, bistable circuit operation is obtained in which the P junctions conduct in alternate sequence.

Figure 6:
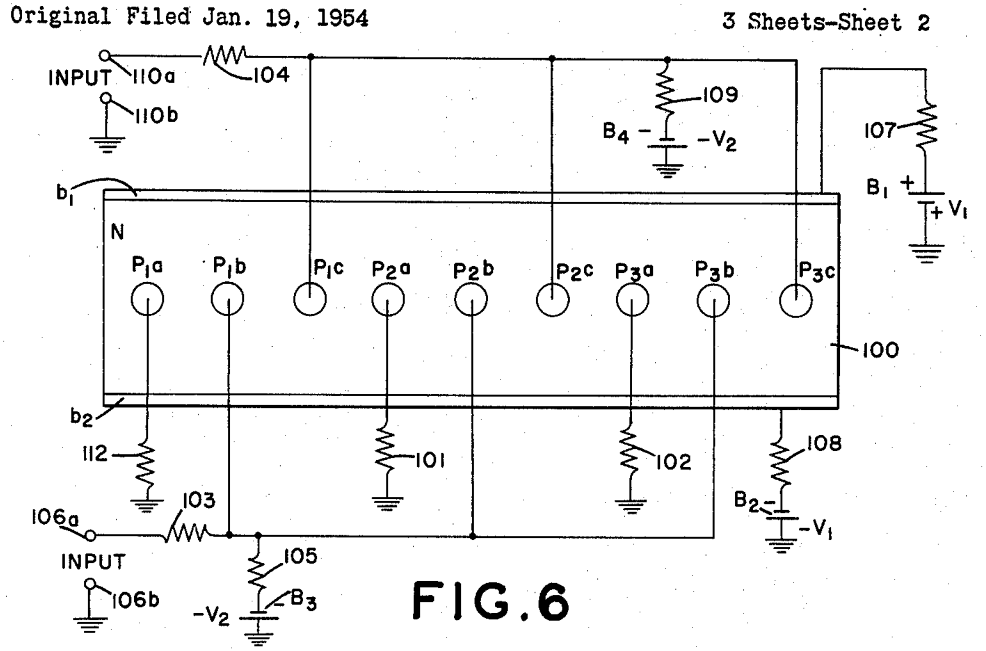
FIGURE 6 is a schematic view of another embodiment of a semiconductor device and associated circuitry according to the present invention which is adapted for current conducting operation successively in any of several stages.
Figure 7:
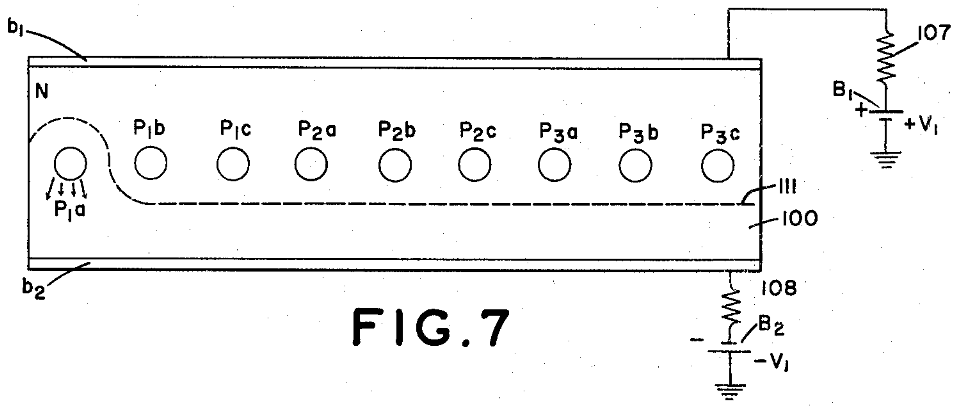
FIGURES 7 and 8 illustrate the current and voltage conditions in the FIGURE 6 device in successive stages of its operation.
Figure 8:
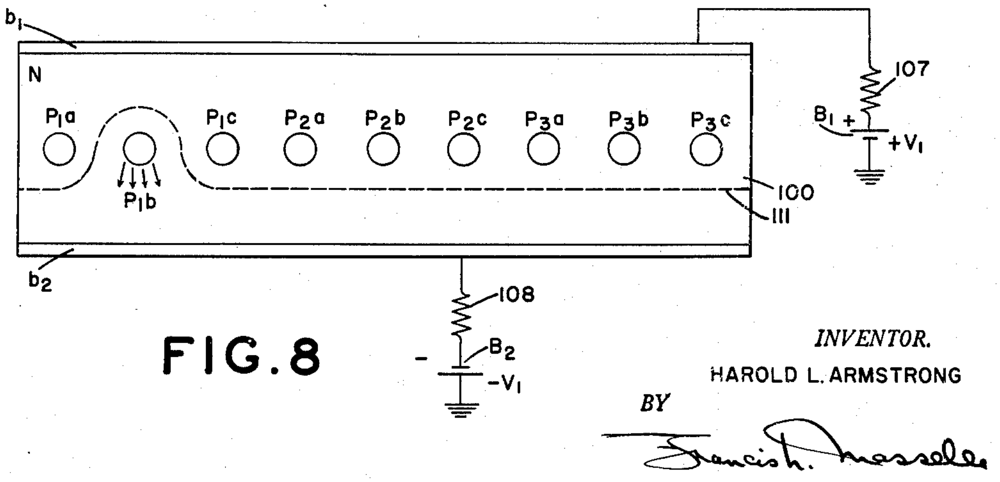

A further embodiment of the present invention is shown in FIGS. 6–8. In this embodiment there is provided a slab 100 of N-type germanium which has a lateral dimension appreciably greater than its length. Positive and negative base electrodes $b_1$ and $b_2$ have ohmic contacts with opposite ends of the germanium slab, extending completely thereacross. The positive base electrode $b_1$ is connected through resistor 107 to a source, battery $B_1$, of positive potential $+V_1$, while the negative base electrode $b_2$ has a connection through a resistor 108 to a source, battery $B_2$, of negative potential $-V_1$. Midway between the base electrodes there are provided a series of P junctions, $P_{1a}$, $P_{1b}$, $P_{1c}$, $P_{2a}$, $P_{2b}$, $P_{2c}$, $P_{3a}$, $P_{3b}$, $P_{3c}$, in the form of evenly spaced indium dots fused into the face of germanium semiconductor. The P junctions $P_{1a}$, $P_{2a}$, $P_{3a}$ are connected to ground through resistors 112, 101, and 102, respectively. The P junctions $P_{1b}$, $P_{2b}$, $P_{3b}$, are connected in parallel with each other and through a common resistor 103 to a common input terminal 106*a*. The junctions $P_{1b}$, $P_{2b}$, and $P_{3b}$ are biased negative with respect to ground through a resistor 105 connected to a source, battery $B_3$, of negative voltage $-V_2$. The other P junctions $P_{1c}$, $P_{2c}$, and $P_{3c}$ are connected in parallel with each other and through a common resistor 104 to a common input terminal 110*a*. The junctions $P_{1c}$, $P_{2c}$, and $P_{3c}$ are biased negative with respect to ground through a common resistor 109 connected to a source, battery $B_4$, of negative voltage $-V_2$. The resistors 107 and 108 are of equal value, so that the zero equipotential in the semiconductor would extend through the portions of the semiconductor contiguous to the P junctions in the absence of current to any of the P junctions.

In the operation of this device, let it be assumed that initially junction $P_{1a}$ is drawing current. The holes injected by junction $P_{1a}$ into the semiconductor 100 are swept to the negative base electrode $b_2$, resulting in current through, and a voltage drop across, resistor 108. Accordingly, $b_2$ will assume a negative potential lower in magnitude than the positive potential at $b_1$, causing the zero equipotential in the semiconductor to assume a position below the P junctions, except adjacent the conducting junction $P_{1a}$. This condition is indicated in FIG. 7, wherein reference numeral 111 denotes the zero equipotential line. This condition, in which $P_{1a}$ draws current, is stable. Thus, at this time, the portion of the semiconductor contiguous to junction $P_{1a}$ is negative with respect to this junction, while the semiconductor contiguous to each of the other P junctions has a potential positive with respect to each of those junctions. Because of the potential distortion due to the hole current injected into the semiconductor 100 by junction $P_{1a}$ at this time, the semiconductor contiguous to the adjacent junction $P_{1b}$ will be less positive than at locations contiguous to the other non-conducting P junctions.

When a positive input signal is applied between input terminals 106*a* and 106*b*, $P_{1b}$ will be driven positive with respect to the semiconductor material contiguous to it. However, the other junctions $P_{2b}$ and $P_{3b}$ to which this same input pulse is applied will not be driven positive with respect to the contiguous semiconductor portions because of the more positive potential of these semiconductor portions than in the semiconductor at $P_{1b}$, these portions of the semiconductor not having been affected as much by the hole current injected into the semiconductor by the remote junction $P_{1a}$. Also, when junction $P_{1b}$ begins to conduct it causes a voltage drop across resistor 108 which causes the potential in the semiconductor underlying the junctions $P_{2b}$ and $P_{3b}$ to remain positive. Also, when $P_{1b}$ conducts there is a resulting voltage drop across resistor 103 in the input circuit for junctions $P_{1b}$, $P_{2b}$ and $P_{3b}$, so that none of these junctions goes very far positive. Therefore, the combined effect is that the junctions $P_{2b}$ and $P_{3b}$ are not driven positive with respect to the underlying semiconductor portions, and neither of these junctions conducts. Consequently, junction $P_{1b}$ only will draw current when this input pulse is received.

The holes injected by junction $P_{1b}$ into the semiconductor will be swept to the negative base electrode $b_2$, resulting in a voltage drop across resistor 108 which maintains base electrode $b_2$ at a negative potential of a magnitude less than the postive potential at base electrode $b_1$, since $b_2$ at this time conducts much more current than $b_1$. Accordingly, the zero equipotential 111 will assume a position closer to the negative base electrode $b_2$ than to the positive base electrode $b_1$, except at the conducting junction $P_{1b}$. This condition is indicated in FIG. 8.

This condition is unstable, lasting only as long as there is a sufficiently positive input signal across input terminals 106*a* and 106*b*. When this input signal is removed, the negative bias $-V_2$ drives $P_{1b}$ negative with respect to the contiguous portion of the semiconductor, cutting off $P_{1b}$. At the same time, the negative base electrode $b_2$ tends to assume the potential $-V_1$, which is more negative than while $P_{1b}$ was conducting. Therefore, the entire zero equipotential 111 tends to shift upward toward the positive base electrode $b_1$. But at this time, because of the hole current just previously injected into the semiconductor by junction $P_{1b}$, the semiconductor contiguous to the adjacent junctions $P_{1a}$ and $P_{1c}$ will be somewhat less positive than at the other nonconducting junctions. Therefore, by applying a properly timed positive signal across input terminals 110*a* and 110*b*, current may be switched to the next junction $P_{1c}$. In effect, the "hump" in the zero equipotential line 111 shifts over to $P_{1c}$ before the zero equipotential has had a chance to level off as a result of the current cut off at $P_{1b}$. When this positive input signal is applied, junction $P_{1c}$ is driven positive with respect to the underlying portion of the semiconductor and will, therefore, draw current, injecting holes into the semiconductor. The other P junctions $P_{2c}$ and $P_{3c}$ connected to input terminal 110*a* will not be driven positive with respect to the underlying portions of the semiconductor when this positive input signal is received across input terminals 110*a*, 110*b* because these underlying portions of the semiconductor had been slightly more positive, while junction $P_{1b}$ was drawing current, than was the portion of the semiconductor contiguous to the adjacent junction $P_{1c}$. In addition, the voltage drops across resistors 104 and 107 resulting from the current to $P_{1c}$ maintain the junctions $P_{2c}$ and $P_{3c}$ negative with respect to the underlying semiconductor portions, so that neither of these junctions conducts at this time.

With junction $P_{1c}$ drawing current, the holes injected by $P_{1c}$ into the semiconductor are swept to the negative base electrode $b_2$, resulting in a voltage drop across resistor 108. Accordingly, the negative base electrode $b_2$ is at a negative potential of less magnitude than the positive potential at the positive base electrode $b_1$. Accordingly, the zero equipotential 111 will assume a position closer to the negative base electrode $b_2$ than to the positive base electrode $b_1$, except at the conducting junction $P_{1c}$. This condition is unstable, lasting only as long as a sufficiently positive input signal exists across input terminals 110*a*, 110*b*.

When the positive input signal at terminals 110*a*, 110*b* is terminated, junction $P_{1c}$ cuts off due to the negative bias from $B_4$ through resistor 109. At the same time, due to the current cut off, the negative base electrode $b_2$ tends to assume the more negative potential $-V_1$, which in turn tends to shift the zero equipotential 111 toward the positive base electrode $b_1$. When this happens, the "hump" in the zero equipotential shifts over to the adjacent grounded junction $P_{2a}$. While junction $P_{1c}$ had been conducting, junction $P_{2a}$ was at ground potential while the other junction $P_{1b}$, adjacent to the conducting junction ($P_{1c}$) was at a potential negative with respect to ground. Due to the distortion of the potential distribution through the semiconductor which resulted from the hole current injected by junction $P_{1c}$, the potential in the semiconductor contiguous to each of the adjacent junctions $P_{1b}$ and $P_{2a}$ as less positive than at the other non-conducting junctions. Therefore, the "hump" in the zero equipotential will shift to the more positive of these adjacent junctions, which in this case is the grounded junction $P_{2a}$.

Therefore, $P_{2a}$ begins to draw current when the positive input signal at $P_{1c}$ is terminated.

The sequence of the foregoing cycle may be repeated so that the junctions $P_{2b}$, $P_{2c}$, $P_{3a}$, $P_{3b}$, and $P_{3c}$ conduct successively in that order.

Figure 9:
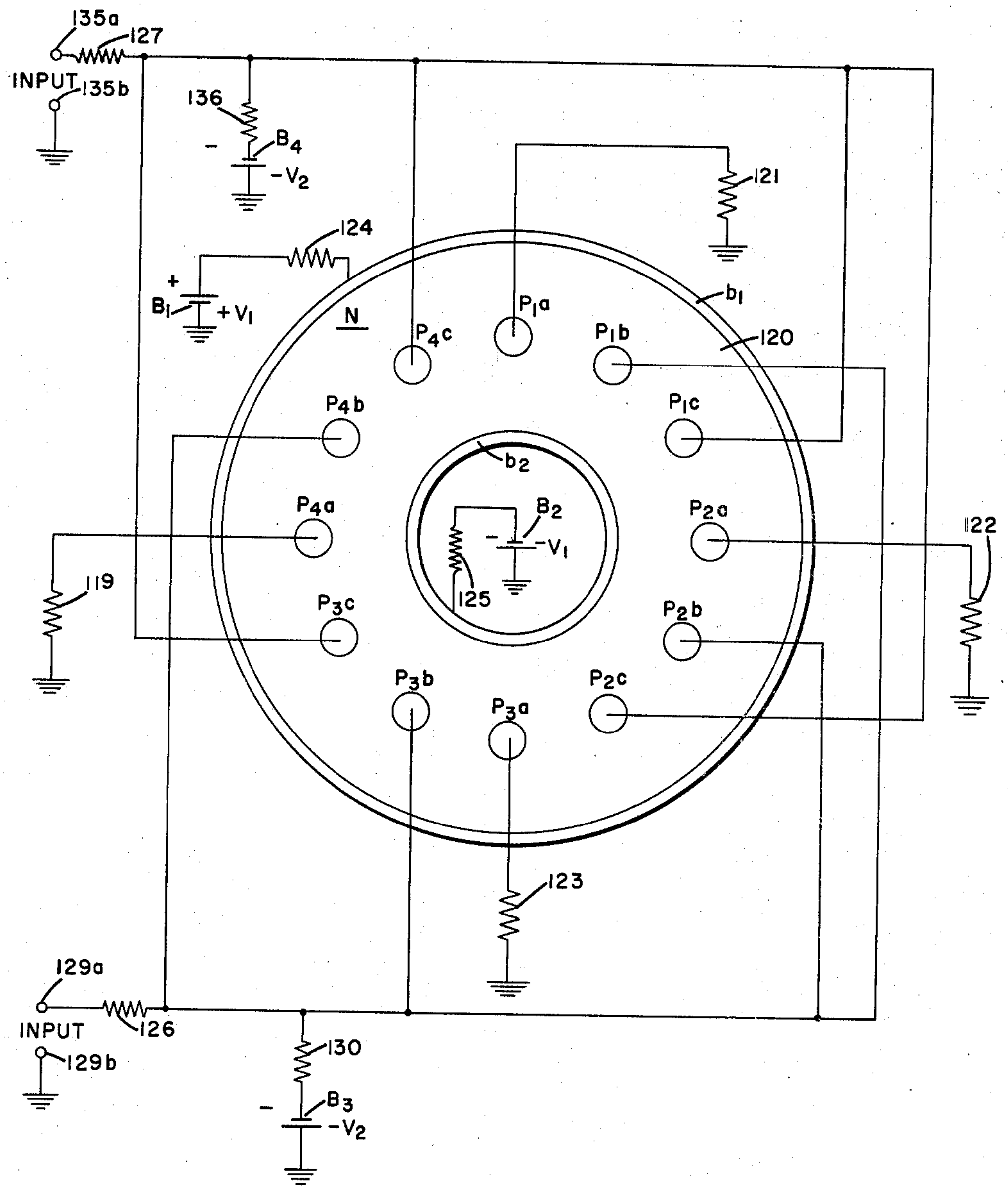
FIGURE 9 shows a ring counter which constitutes a still further embodiment of the present invention.

FIGURE 9 illustrates a still further embodiment of the present invention intended for use as a ring counter. In this embodiment the semiconductor is in the form of a flat annular disk 120 of N type germanium. A positive base electrode $b_1$ has ohmic contact with germanium disk entirely around its outer periphery and is biased from a source, battery $B_1$, of positive potential $+V_1$ through resistor 124. The negative base electrode $b_2$ has ohmic contact at the inner periphery of the annular germanium disk 120 and is biased from a source, battery $B_2$, of negative potential $-V_1$ through resistor 125. Midway between the positive and negative base electrodes, there are provided a series of indium dots $P_{1a}$, $P_{1b}$, $P_{1c}$, $P_{2a}$, $P_{2b}$, $P_{2c}$, $P_{3a}$, $P_{3b}$, $P_{3c}$, $P_{4a}$, $P_{4b}$, and $P_{4c}$ arranged in circular fashion and fused into one face of the semiconductor. These indium dots provide evenly spaced P junctions on the semiconductor midway between the positive and negative base electrodes. The junctions $P_{1a}$, $P_{2a}$, $P_{3a}$, and $P_{4a}$ are connected to ground through resistors 121, 122, 123, and 119, respectively. The junctions $P_{1b}$, $P_{2b}$, $P_{3b}$, and $P_{4b}$ are connected in parallel with each other and through a common resistor 126 to a common input terminal 129*a*. Each of these junctions $P_{1b}$ . . . $P_{4b}$ is normally biased negative from a source, battery $B_3$, of negative voltage at a potential $-V_2$ through resistor 130. The other P junctions, $P_{1c}$, $P_{2c}$, $P_{3c}$, and $P_{4c}$ are connected in parallel with each other and through a common resistor 127 to a common input terminal 135*a*. Through a resistor 136 each of the junctions $P_{1c}$ . . . $P_{4c}$ is biased source, battery $B_4$, of negative from a negative voltage at a potential $-V_1$.

In the operation of this device, assuming that junction $P_{1a}$ is drawing current initially, the hole current injected by $P_{1a}$ into the semiconductor 120 will be swept toward the negative base electrode $b_2$. Due to this hole current, the potential gradient through the semiconductor between the base electrodes will be distorted so that the zero equipotential will extend between junction $P_{1a}$ and the positive base electrode $b_1$ and between each of the non-conducting electrodes $P_{1b}$, $P_{1c}$, etc., and the negative base electrode $b_2$. Therefore, at each of these non-conducting junctions the germanium will be at a potential positive with respect to each non-conducting junction. However, the germanium underlying the junctions $P_{1b}$ and $P_{4c}$, which are adjacent the conducting junction $P_{1a}$, will be less positive than at the other non-conducting junctions due to the effect of the hole current injected into the semiconductor by the conducting junction $P_{1a}$.

If, next, a positive input signal is applied between input terminals 129*a*, 129*b*, it will drive junction $P_{1b}$ positive with respect to the underlying germanium. This junction will begin to draw current, emitting hole current into the semiconductor which is swept toward the negative base electrode $b_2$. This distorts the potential gradient in the semiconductor so that the "hump" in the zero equipotential shifts to junction $P_{1b}$. The previously conducting junction $P_{1a}$ is cut off and the other junctions remain non-conducting. This positive input signal at terminals 129*a*, 129*b* does not drive either of the junctions $P_{2b}$, $P_{3b}$, and $P_{4b}$, positive with respect to the underlying germanium because those portions of the semiconductor had been more positive while junction $P_{1a}$ was conducting than was the germanium underlying junction $P_{1b}$. Also, as in the embodiment of FIGS. 6–8, the voltage drops across resistors 126 and 125 due to the current to $P_{1b}$ maintain the portions of the semiconductor underlying junctions $P_{2b}$, $P_{3b}$, and $P_{4b}$ negative with respect to these junctions. Junction $P_{1b}$ continues to draw current only as long as there is a positive input signal at terminals 129*a*, 129*b*.

By substantially immediately applying a positive input signal to the input terminals 135*a*, 135*b* the next junction, $P_{1c}$, in the series may be rendered conductive in like manner as just described, cutting off all of the other junctions.

Then, after the positive input signal across terminals 135*a*, 135*b* is removed, the grounded junction $P_{2a}$ would conduct next.

The foregoing sequence may be repeated indefinitely to render the other junctions $P_{1b}$ . . . $P_{4c}$ conductive in succession, providing a ring counter type device quite similar in operation to the device of FIG. 6–8, described in detail above.

From the foregoing description, it will be evident that the present invention is susceptible of numerous and varied embodiments, which are adapted for various particular applications. However, while in the foregoing description and the accompanying drawings there have been disclosed several specific preferred embodiments of the present invention, it is to be understood that various modifications, omissions and refinements which depart from the specific disclosed embodiments may be adopted without departing from the spirit and scope of this invention.

I claim:

1. A semiconductor device comprising a semiconductor, means for establishing a potential gradient through the semiconductor, an electrode having a first rectifying junction of one conductivity type on one face of the semiconductor, and a pair of electrodes having spaced rectifying junctions of the same conductivity type as each other and different from that of said first rectifying junction on the opposite face of the semiconductor, the semiconductor contiguous to said rectifying junctions being at equal potentials in the absence of current to one of said rectifying junctions.

2. A semiconductor device comprising a semiconductor, an electrode having a first rectifying junction of one conductivity type to one face of the semiconductor intermediate its ends, a pair of electrodes having spaced rectifying junctions of the same conductivity type as each other, and different from that of said first rectifying junction, to the opposite face of the semiconductor intermediate its ends, and a pair of base electrodes having ohmic contacts to opposite ends of the semiconductor and biased differently to establish a potential gradient through the semiconductor with the portions of the semiconductor contiguous to the rectifying junctions being at equal potentials in the absence of current to any of the rectifying junctions.

3. A semiconductor device comprising a body of semiconductor material of one conductivity type having spaced faces, means for establishing a potential gradient parallel to said faces in said semiconductor, and a plurality of electrodes having rectifying junctions of a different conductivity type to one face of the semiconductor at locations thereon which are simultaneously at equal potentials in the absence of current to any of the rectifying junctions, and means for rendering said rectifying junctions conductive individually in succession.

4. A ring counter comprising a semiconductor of one conductivity type having spaced faces, base electrodes having ohmic connections to spaced portions of the semiconductor and biased differently to establish a potential gradient parallel to said faces in the semiconductor, a plurality of electrodes having rectifying junctions of a different conductivity type on the semiconductor, said rectifying junctions being arranged in an annular series on the face of the semiconductor between said base electrodes at locations on the semiconductor which are simultaneously at equal potentials intermediate those of the base electrodes in the absence of current to any of the rectifying junctions, and means for rendering said rectifying junctions conductive individually in succession.

5. A semiconductor device comprising a semiconductor of one conductivity-type, base electrodes having ohmic connections to the semiconductor at spaced locations thereon for establishing an electric field therein, a plurality of electrodes having rectifying junctions of the same conductivity-type as each other and different from the conductivity-type of the semiconductor to one face of the semiconductor between the base electrodes at locations which are simultaneously at the same potential intermediate the potentials at the base electrodes in the absence of current between any of the rectifying junction electrodes and the semiconductor, and means for rendering said rectifying junctions conductive individually in succession.

6. A semiconductor device comprising a quadrangular plate of semiconductor material of one conductivity-type, a respective base electrode making ohmic contact with said semiconductor on each of one pair of opposite edges thereof, a plurality of electrodes having rectifying junctions of the same conductvity-type as each other and different from the conductivity-type of said semiconductor disposed on the face of said semiconductor plate at equally spaced locations along a line substantially parallel to and midway between said base electrodes, and means for rendering said rectifying junctions conductive individually in succession.

7. A semiconductor device comprising an annular semiconductor of one conductivity-type, respective base electrodes making ohmic contact with said semiconductor along the inner and outer circumferences thereof, a plurality of electrodes having the same conductivity-type as each other and different from the conductivity-type of said semiconductor forming rectifying junctions therewith, said junctions being arranged to form an annulus concentric with and spaced radially midway between said base electrodes, and means for rendering said rectifying junctions conductive individually in succession.

References Cited by the Examiner

UNITED STATES PATENTS

| | | | |
|---|---|---|---|
| 2,655,607 | 10/53 | Reeves | 307—88.5 |
| 2,851,615 | 9/58 | Sziklai et al. | 307—88.5 |
| 2,889,469 | 6/59 | Green | 307—88.5 |

JOHN W. HUCKERT, *Primary Examiner.*

HERMAN K. SAALBACH, GEORGE N. WESTBY, ARTHUR GAUSS, *Examiners.*